United States Patent
Van Den Dungen et al.

(10) Patent No.: US 8,508,712 B2
(45) Date of Patent: Aug. 13, 2013

(54) FLUID HANDLING STRUCTURE, LITHOGRAPHIC APPARATUS AND DEVICE MANUFACTURING METHOD

(75) Inventors: Clemens Johannes Gerardus Van Den Dungen, Eindhoven (NL); Danny Maria Hubertus Philips, Son en Breugel (NL); Koen Steffens, Veldhoven (NL); Tijmen Wilfred Mathijs Gunther, Utrecht (NL); David Bessems, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 774 days.

(21) Appl. No.: 12/582,919

(22) Filed: Oct. 21, 2009

(65) Prior Publication Data

US 2010/0103391 A1 Apr. 29, 2010

Related U.S. Application Data

(60) Provisional application No. 61/193,039, filed on Oct. 23, 2008.

(51) Int. Cl.
*G03B 27/52* (2006.01)
*G03B 27/54* (2006.01)
*G03B 27/58* (2006.01)
*G03B 27/32* (2006.01)
*G03B 27/68* (2006.01)
*G03B 27/42* (2006.01)

(52) U.S. Cl.
USPC .................. 355/30; 355/52; 355/53; 355/55; 355/67; 355/72; 355/77

(58) Field of Classification Search
USPC .................. 355/30, 52, 53, 55, 67, 72–75, 77; 250/492.1, 492.2, 492.22, 548; 430/22, 30, 430/311, 312
See application file for complete search history.

(56) References Cited

U.S. PATENT DOCUMENTS

| | | | |
|---|---|---|---|
| 4,509,852 A | 4/1985 | Tabarelli et al. | |
| 4,637,656 A * | 1/1987 | Medeot | 299/1.5 |
| 6,187,214 B1 * | 2/2001 | Ganan-Calvo | 216/92 |
| 7,701,551 B2 | 4/2010 | De Graaf | |
| 2002/0104454 A1 * | 8/2002 | Verschueren | 101/450.1 |

(Continued)

FOREIGN PATENT DOCUMENTS

| | | |
|---|---|---|
| EP | 1 420 298 A2 | 5/2004 |
| EP | 1 420 300 A2 | 5/2004 |

(Continued)

OTHER PUBLICATIONS

Japanese Office Action mailed Oct. 19, 2011 in corresponding Japanese Patent Application No. 2009-237996.

(Continued)

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A fluid handling structure and lithographic apparatus is disclosed in which measures are taken, in particular to the dimensions and spacing of an array of openings in a bottom surface of the fluid handling structure, to deal with and/or prevent formation of bubbles in immersion liquid.

18 Claims, 6 Drawing Sheets

(56) References Cited

U.S. PATENT DOCUMENTS

| | | |
|---|---|---|
| 2004/0207824 A1 | 10/2004 | Lof et al. |
| 2004/0257544 A1* | 12/2004 | Vogel et al. .............. 355/30 |
| 2005/0018155 A1* | 1/2005 | Cox et al. ................. 355/30 |
| 2005/0168713 A1 | 8/2005 | Vogel et al. |
| 2005/0259234 A1* | 11/2005 | Hirukawa et al. .......... 355/53 |
| 2006/0023183 A1* | 2/2006 | Novak et al. ............... 355/53 |
| 2006/0038968 A1 | 2/2006 | Kemper et al. |
| 2006/0066826 A1 | 3/2006 | Luijten et al. |
| 2006/0077367 A1* | 4/2006 | Kobayashi et al. ........ 355/53 |
| 2006/0087630 A1* | 4/2006 | Kemper et al. ............. 355/30 |
| 2006/0119809 A1 | 6/2006 | Verhagen et al. |
| 2006/0221315 A1* | 10/2006 | Beckers et al. ............. 355/30 |
| 2006/0290909 A1* | 12/2006 | Donders et al. ............ 355/53 |
| 2007/0002299 A1* | 1/2007 | Imai et al. ................. 355/55 |
| 2007/0017626 A1 | 1/2007 | Pearson et al. |
| 2007/0110213 A1* | 5/2007 | Leenders et al. ........... 378/34 |
| 2007/0243329 A1* | 10/2007 | De Graaf .................. 427/256 |
| 2007/0268466 A1 | 11/2007 | Leenders et al. |
| 2008/0212046 A1 | 9/2008 | Riepen et al. |
| 2009/0174871 A1* | 7/2009 | Petrus De Jong et al. ...... 355/30 |

FOREIGN PATENT DOCUMENTS

| | | |
|---|---|---|
| JP | 2005-012228 | 1/2005 |
| JP | 2005-045223 | 2/2005 |
| JP | 2006-093709 | 4/2006 |
| JP | 2006-253456 | 9/2006 |
| JP | 2006-295161 | 10/2006 |
| JP | 2006-523029 | 10/2006 |
| JP | 2007-288185 | 11/2007 |
| JP | 2007-318117 | 12/2007 |
| JP | 2008-147652 | 6/2008 |
| WO | WO 99/49504 A1 | 9/1999 |
| WO | WO 2005/064405 A2 | 7/2005 |
| WO | WO 2007017626 A1 * | 2/2007 |

OTHER PUBLICATIONS

Van Bokhoven et al., U.S. Appl. No. 61/136,380, filed Sep. 2, 2008.
Direcks et al., U.S. Appl. No. 61/071,621, filed May 8, 2008.

* cited by examiner

FLUID HANDLING STRUCTURE, LITHOGRAPHIC APPARATUS AND DEVICE MANUFACTURING METHOD This application claims priority and benefit under 35 U.S.C. §119(e) to U.S. Provisional Patent Application No. 61/193,039, entitled "Fluid Handling Structure, Lithographic Apparatus and Device Manufacturing Method", filed on Oct. 23, 2008. The content of that application is incorporated herein in its entirety by reference.

FIELD

The present invention relates to a fluid handling structure, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scamiing"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although other liquids can be used. An embodiment of the present invention will be described with reference to liquid. However, fluids may be suitable, particularly wetting fluids, incompressible fluids and/or fluids with higher refractive index than air, desirably a higher refractive index than water. Fluids excluding gases are particularly desired. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein, or liquids with nano-particle suspensions (e.g. particles with a maximum dimension of up to 10 nm). The suspended particles may or may not have a similar or the same refractive index as the liquid in which they are suspended. Other liquids which may be suitable are hydrocarbons, such as aromatics, fluorohydrocarbons, and aqueous solutions.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion liquid is handled by a fluid handling system, structure or apparatus. In an embodiment the fluid handling system may supply immersion fluid or liquid and therefore be a fluid supply system. In an embodiment the fluid handling system may at least partly confine fluid and thereby be a fluid confinement system. In an embodiment the fluid handling system may provide a barrier to fluid and thereby be a barrier member, such as a fluid confinement structure. In an embodiment the fluid handling system may create or use a flow of gas, for example to help in controlling the flow and/or the position of liquid. The flow of gas may form a seal to confine the fluid so the fluid handling structure may be referred to a seal member; such a seal member may be a fluid confinement structure. In an embodiment immersion liquid rather than immersion fluid is used. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate (as indicated by an arrow), preferably along the direction of movement of the substrate relative to the final element, and is removed by at least one outlet after having passed under the projection system (as indicated by an arrow). That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Another arrangement which has been proposed is to provide the liquid supply system with a seal member. The seal member may extend along at least a part of a boundary of the space between the final element of the projection system and the substrate table. Such an arrangement is illustrated in FIG. 4. The seal member is substantially stationary relative to the projection system in the XY plane though there may be some relative movement in the Z direction (in the direction of the optical axis). A seal is formed between the seal member and the surface of the substrate. Desirably the seal is a contactless seal such as a gas seal. Such as system with a gas seal is disclosed in European patent application publication no. EP-A-1,420,298 and illustrated in FIG. 5.

In European patent application publication no. EP-A-1,420,300 the idea of a twin or dual stage immersion lithography apparatus is disclosed. Such an apparatus is provided with two stages for supporting the substrate. Leveling measurements are carried out with a stage at a first position, without immersion liquid, and exposure is carried out with a stage at a second position, where immersion liquid is present. Alternatively, the apparatus has only one stage.

PCT patent application publication no. WO 2005/064405 discloses an all wet arrangement in which the immersion liquid is unconfined. In such a system the whole top surface of the substrate is covered in liquid. This is advantageous because then the whole top surface of the substrate is exposed to the same conditions. This has advantages for temperature control and processing of the substrate. In PCT patent application publication no. WO2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid can still occur. One way of alleviating that problem is described in United States patent application no. US 2006/119809 in which a member is provided which covers the substrate W in all positions and which is arranged to have immersion liquid extending between it and the top surface of the substrate and/or substrate table which holds the substrate.

The formation of a bubble in immersion liquid is desirably to be avoided. A bubble in the immersion liquid can find its way into the immersion space which is between the final element of a projection system and the substrate. A bubble in the immersion space can lead to imaging errors. The presence of a bubble in the immersion liquid, particularly in the space, is to be avoided.

SUMMARY

It is desirable, for example, to provide a fluid handling system in which the chance of bubbles being generated and/or finding their way into the immersion space is reduced.

According to an aspect, there is provided a lithographic apparatus comprising: a substrate table configured to support a substrate; and a fluid handling structure having an opening. The opening has a dimension. In use the opening is positioned to direct a flow of liquid towards the substrate and/or the substrate table. In use, the opening is spaced from the substrate and/or the substrate table by an operating distance. The dimension of the opening is less than the operating distance divided by 3.5.

According to an aspect, there is provided a lithographic apparatus comprising: a substrate table configured to support a substrate; and a fluid handling structure having an opening. The opening has a dimension. The opening is positioned in use to direct a liquid flow towards the substrate and/or the substrate table. The dimension of the opening is such that in use the liquid flow through the opening forms a jet core having an end. The end of the jet core is positioned between the opening and the substrate and/or substrate table.

According to an aspect, there is provided a lithographic apparatus comprising: a substrate table configured to support a substrate. The substrate table comprises a gap between the edge of the substrate table and the substrate. The gap has a depth. A fluid handling structure has an opening. The opening has a dimension. In use the opening is positioned to direct a flow of liquid towards the substrate and/or the substrate table. In use, the opening is spaced from the substrate and/or the substrate table by an operating distance. The dimension of the opening is less than 1/3.5 multiplied by the sum of the operating distance and half of the depth of the gap.

According to an aspect, there is provided a lithographic apparatus comprising a substrate table configured to support a substrate. The substrate table comprises a gap between the edge of the substrate table and the substrate. A fluid handling structure has an opening. The opening has a dimension. In use the opening is positioned to direct a liquid flow towards the substrate and/or the substrate table. The dimension of the opening is such that in use the liquid flow through the opening forms a jet core having an end. The end of the jet core is positioned between the opening and half way down the gap.

According to an aspect, there is a lithographic apparatus comprising: a substrate table configured to support a substrate; and a fluid handling structure having an array of openings. Adjacent openings in the array are a distance apart. In use the array of openings is positioned to direct a flow of fluid towards the substrate and/or substrate table. In use the array of openings is positioned to be at an operating distance away from the substrate and/or substrate table. The distance between adjacent openings in the array is less than 1.16 times the operating distance.

According to an aspect, there is provided a lithographic apparatus comprising: a substrate table configured to support a substrate; and a fluid handling structure having an array of openings. Adjacent openings in the array are positioned a distance apart. In use the array of openings is configured to direct a liquid flow towards the substrate and/or substrate table. The liquid flow through each opening forms a jet. The distance between adjacent openings in the array is such that the jets of liquid exiting adjacent openings meet before reaching the substrate and/or substrate table.

According to an aspect, there is provided a fluid handling structure having a groove in a bottom surface which faces the substrate and/or substrate table in use, and at least one opening in the groove. The opening is constructed and arranged to direct, in use, a flow of liquid towards a substrate and/or a substrate table configured to support the substrate.

According to an aspect, there is provided a device manufacturing method comprising: providing a fluid between a final element of a projection system and a substrate and/or a substrate table configured to support the substrate. The providing includes supplying liquid between a fluid handling structure and the substrate through an opening. A dimension of the opening is less than the distance between the opening and the substrate divided by 3.5.

According to an aspect, there is provided a device manufacturing method comprising: providing a fluid between a final element of a projection system and a substrate and/or a substrate table configured to support the substrate. The providing includes supplying liquid between a fluid handling structure and the substrate through an opening. A dimension of the opening is less than 1/3.5 multiplied by the distance between the opening and the substrate and half of the depth of a gap between the edge of the substrate table and the substrate.

According to an aspect, there is provided a device manufacturing method comprising: providing a fluid between a final element of a projection system and a substrate and/or a substrate table configured to support the substrate. The providing includes supplying liquid between a fluid handling structure and the substrate and/or the substrate table through an array of openings. Adjacent openings of the array are positioned apart by less than 1.16 times the distance of at least one of the openings from the substrate.

According to an aspect, there is provided a device manufacturing method comprising: providing a fluid between the final element of a projection system and a substrate and/or a substrate table configured to support the substrate. The providing includes supplying liquid between a fluid handling structure and the substrate and/or the substrate table through an opening. The opening is defined in a surface of a groove located in a bottom surface of a fluid handling structure. The bottom surface faces the substrate and/or the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figures 1, 1A, 1B:
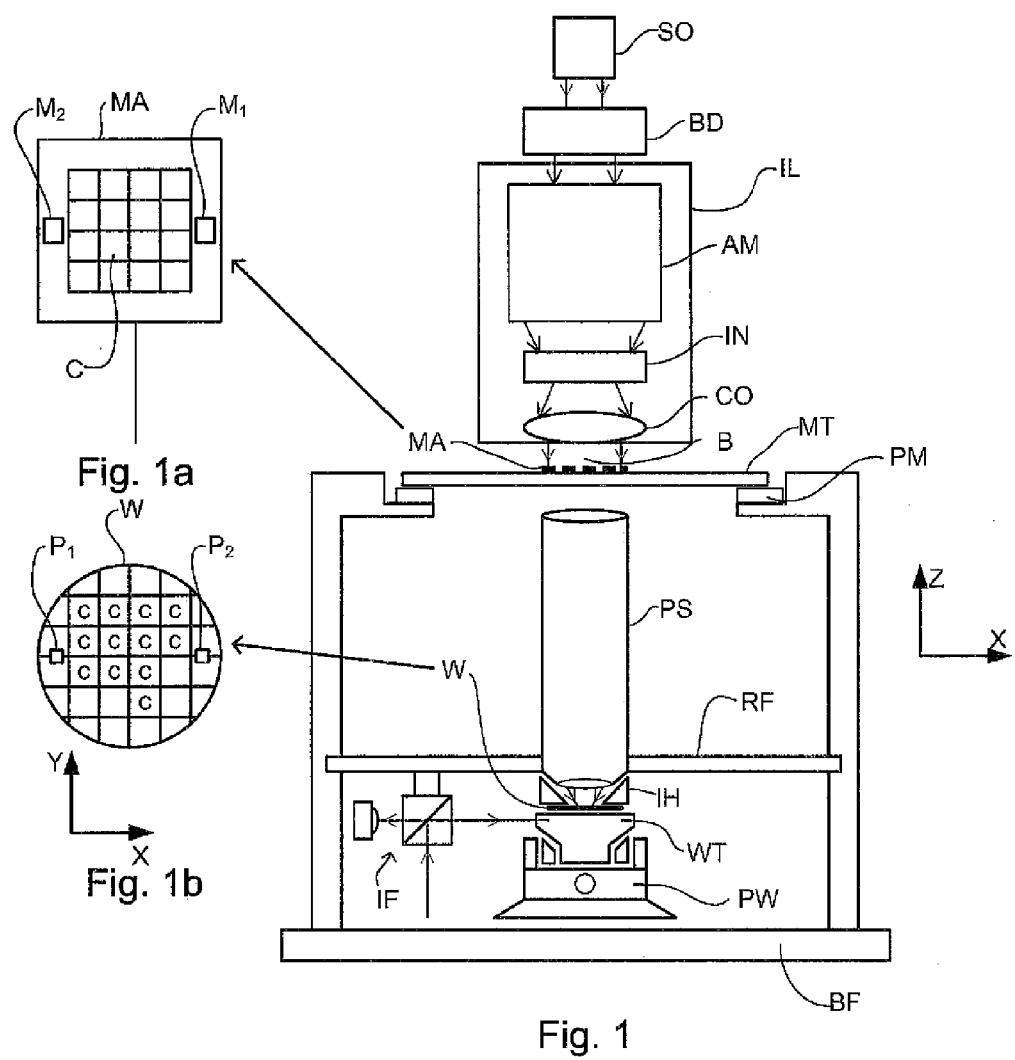
FIG. 1 depicts a lithographic apparatus according to an embodiment of the invention.
Figure 2:
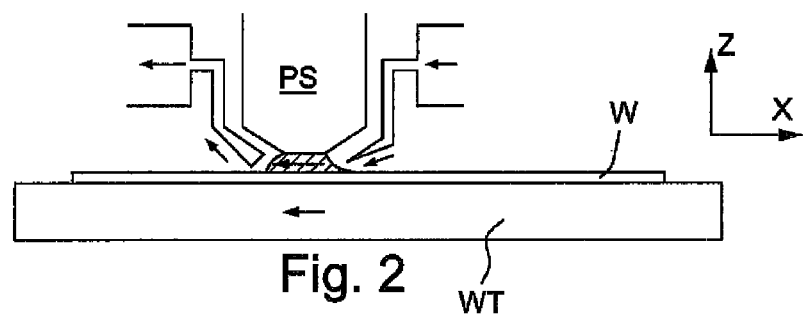
FIGS. 2 and 3 depict a liquid supply system for use in a lithographic projection apparatus.
Figure 3:
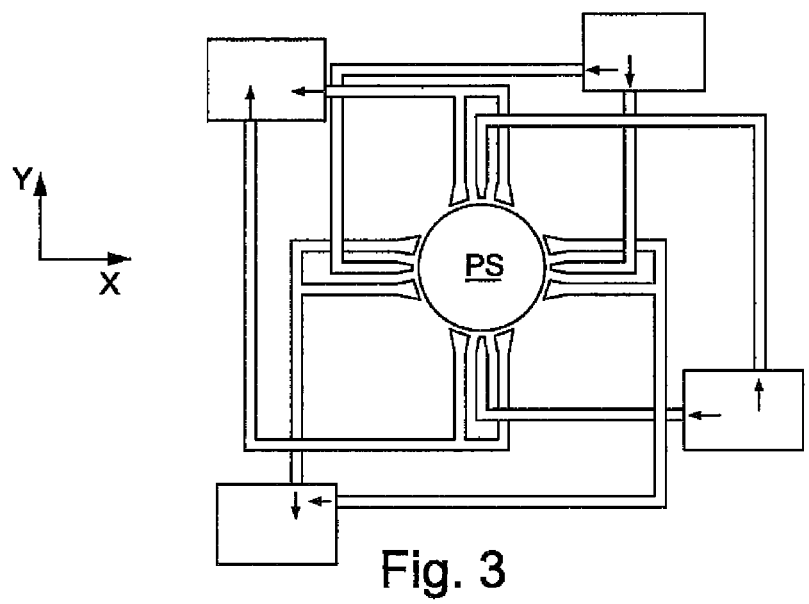
Figure 4:
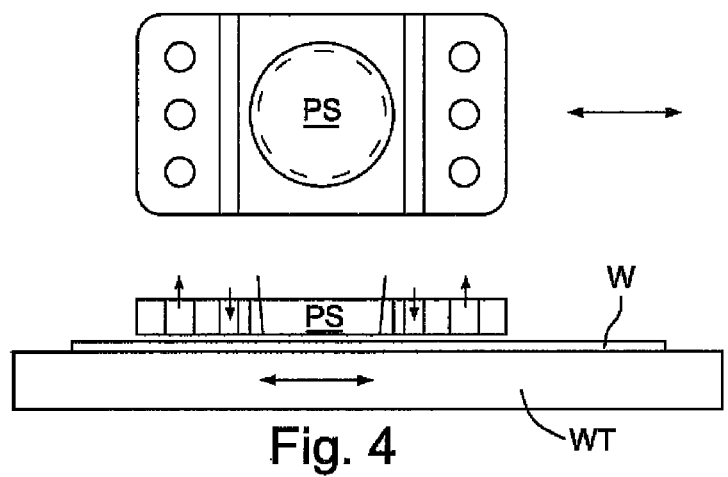
FIG. 4 depicts a further liquid supply system for use in a lithographic projection apparatus.

FIG. 1 schematically depicts a lithographic apparatus according to one embodiment of the invention. The apparatus comprises:

an illumination system (illuminator) FL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into at least two categories. These are the bath type arrangement in which substantially the whole of the substrate W and optionally part of the substrate table WT is submersed in a bath of liquid and the so called localized immersion system which use liquid supply systems in which liquid is only provided to a localized area of the substrate. In the latter category, the space filled by liquid is smaller in plan than the top surface of the substrate and the area filled with liquid remains stationary relative to the projection system PS while the substrate W moves underneath that area.

A further arrangement, to which an embodiment of the present invention is directed, is the all wet solution in which the liquid is unconfined. In this arrangement the whole top surface of the substrate and all or part of the substrate table is covered in immersion liquid. The depth of the liquid covering at least the substrate is small. The liquid may be a film, such as a thin film, of liquid on the wafer. Any of the liquid supply devices of FIGS. 2-5 can also be used in such a system. However, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
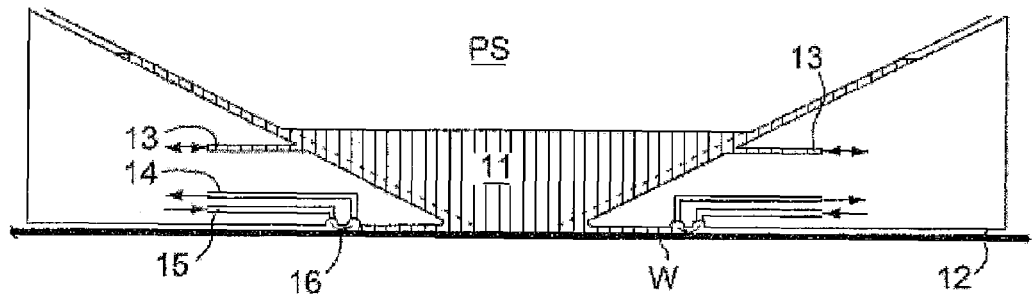
FIG. 5 depicts a further liquid supply system for use in a lithographic projection apparatus.

FIG. 5 schematically depicts a localized liquid supply system or fluid handling structure with a barrier member or fluid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid confinement structure 12 is substantially stationary relative to the projection system in the XY plane though there may be some relative movement in the Z direction (in the direction of the optical axis). In an embodiment, a seal is formed between the fluid confinement structure and the surface of the substrate W and may be a contactless seal such as a gas seal or fluid seal.

The fluid confinement structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid confinement structure 12 positioned below and surrounding the final element of the projection system PS. Liquid is brought into the space below the projection system and within the fluid confinement structure 12 by liquid inlet 13. The liquid may be removed by liquid outlet 13. The fluid confinement structure 12 may extend a little above the final element of the projection system. The liquid level rises above the final element so that a buffer of liquid is provided. In an embodiment, the fluid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid is contained in the space 11 by a gas seal 16 which, during use, is formed between the bottom of the fluid confinement structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

An embodiment of the present invention can be applied to any type of fluid handling system used in an immersion apparatus. The example of FIG. 5 is a so called localized area arrangement in which liquid is only provided to a localized area of the top surface of the substrate W at any one time. Other arrangements are possible, including fluid handling systems which make use of single phase extractors (whether or not they work in two phase mode), for example US patent application publication no. US 2006-0038968 A1 filed on 19 Aug. 2004. In an embodiment, a single phase extractor may comprise an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 μm. In an embodiment, porous material is at least slightly hydrophilic, i.e. having a contact angle of less than 90° to the immersion liquid, e.g. water. Another arrangement which is possible is one which works on an air drag principle. The so-called air drag principle has been described, for example, in U.S. patent application with Ser. No. 11/987,569 filed on 30 Nov. 2007 and U.S. patent application with Ser. No. 61/071,621 filed on 8 May 2008. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention can also be applied to fluid handling structures used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. patent application with Ser. No. 61/136,380 filed on 2 Sep. 2008.

Figure 6:
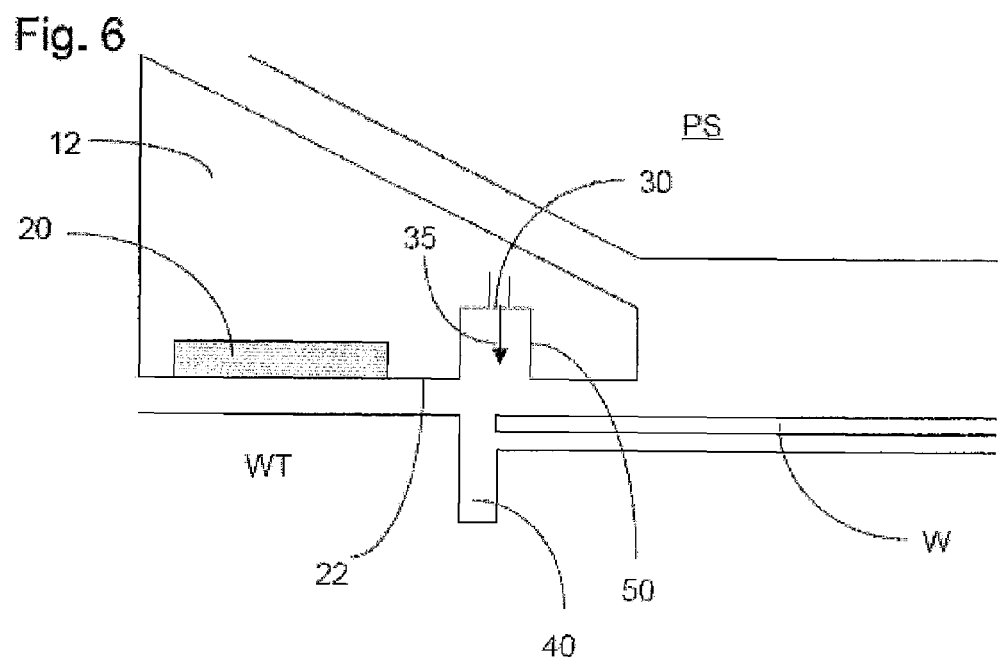
FIG. 6 is a schematic illustration, in cross-section, of a fluid handling system according to an embodiment of the present invention.

FIG. 6 illustrates schematically, in cross-section, a fluid handling system 12, which is depicted in FIG. 1 as IH. The fluid handling system 12 confines immersion liquid to an immersion space 11 between the projection system PS and the substrate W. The fluid handling system 12 can provide liquid to the immersion space 11. However, for simplicity, any openings (i.e. inlets and outlets) for liquid into and/or out of the immersion space 11 are not illustrated. The openings may be any of any suitable type and configuration such as those described with reference to the single phase extractor, the porous plate, air-drag and all-wet. If the fluid handling system 12 is of the type used to confine immersion liquid to a localized area, one or more sealing features 20 may be present on an undersurface 22 of the fluid confinement structure 12. The sealing feature 20 may be of any type, for example any of a gas seal such as a gas knife, liquid extraction, and a meniscus pinning feature. The meniscus pinning feature may have a point which is configured to secure a liquid meniscus. The undersurface 22 faces the substrate and/or substrate table WT during use. The undersurface 22 may be substantially parallel to the top surface of the substrate table WT and/or substrate W. The sealing features 20 may not be present or may be less efficient or may be deactivated, for example in an all wet embodiment.

At least one opening 30 is present in the fluid handling system 12. The opening 30 is configured in use to direct a fluid flow towards the substrate table WT or substrate W. The opening 30 is used to provide liquid in the direction of arrow 35. The opening 30 may be configured and positioned in a surface of the fluid handling structure to direct a flow of liquid perpendicular to the top surface of the substrate table and/or substrate. The opening may be defined in the surface which may be substantially parallel to the top surface of the substrate table WT and/or substrate W.

Bubbles may form when the fluid handling system 12 passes over a gap 40 between the substrate table WT and the edge of the substrate W. It has been found that providing fluid out of an outlet 30 in direction 35 is beneficial in preventing bubble formation when the fluid handling system 12 passes over the gap 40.

Figure 7A:
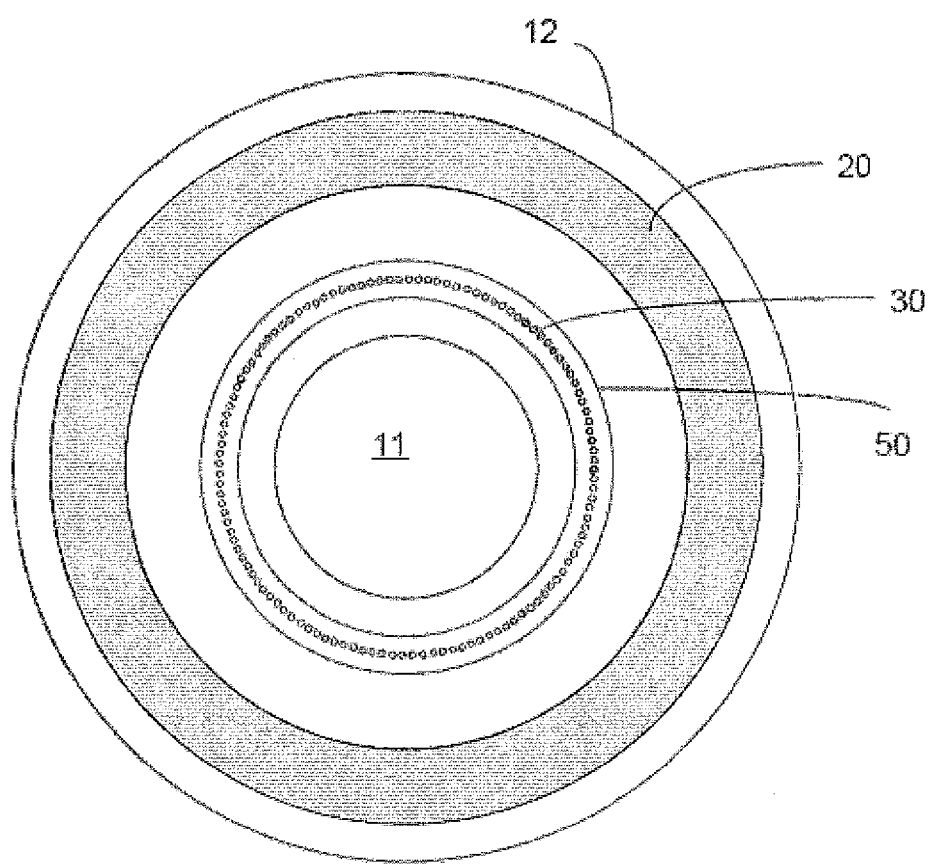
FIGS. 7a and b depict, in plan, two embodiments of the fluid handling system of FIG. 6.
Figure 7B:
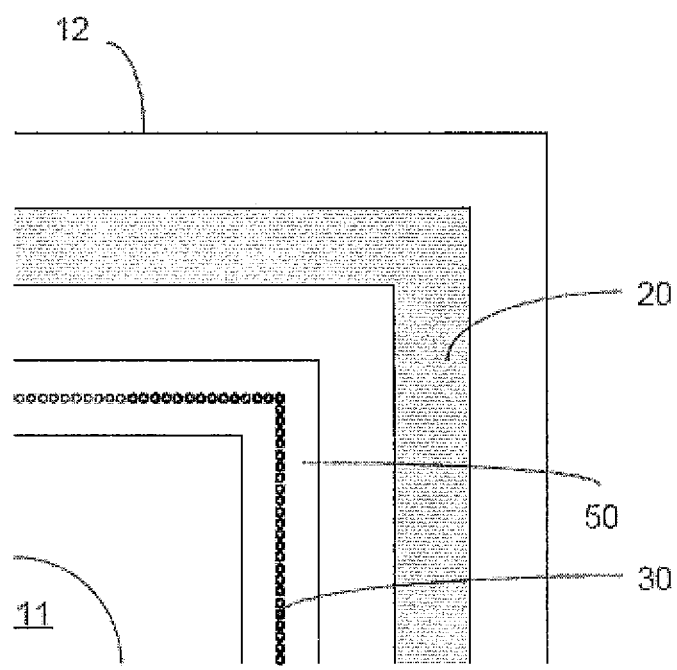

As will be described with reference to FIG. 8, it has also been found that using a plurality of openings 30 arranged in an array is beneficial. In one embodiment the array extends around the periphery of the immersion space 11, i.e. the circumference of the immersion space as illustrated in FIGS. 7a and 7b. FIG. 7a is a plan view of a first embodiment of the fluid handling system 12 of FIG. 6. In the first embodiment, the features on the undersurface 22 of the fluid handling system 12 are all arranged, in plan, in a circular pattern. In a second embodiment, as illustrated in FIG. 7b (which only shows one quarter of the fluid handling system 12), the sealing feature 20, openings 30 and groove 50 are arranged in a shape which has at least one corner. The flow of liquid 35 towards the substrate table WT and substrate W can help in filling the gap 40 with liquid. Thereby bubbles are avoided from being entrapped in the gap 40 and finding their way into the immersion space 11 where they can interfere with imaging to cause imaging defects.

An embodiment of the present invention is directed to the dimensions of the opening(s) 30 so that the effect of the liquid flow 35 is optimized. As will be apparent from the following description, particularly in relation to FIG. 8, it is desirable to provide the opening 30 as far away from the top surface of the substrate table WT for substrate W as is possible.

However, this desirability is opposite to the desirability to have a "fly height" (which is the distance between the bottom of the fluid handling system 12 and the top surface of the substrate table WT or substrate W) as small as possible. A small fly height generally allows for better containment of immersion liquid in the immersion space 11. Therefore, in one embodiment a groove 50 is defined in the undersurface 22 of the fluid handling system 12. The groove 50 is an optional feature and the openings 30 could be in the undersurface 22. The opening 30 is defined in a surface of the groove 50. In this way the distance between the opening 30 and the top surface of the substrate table WT or substrate W (called the operating distance) can be increased without deleteriously increasing the fly height of the fluid handling system 12.

Figure 8:
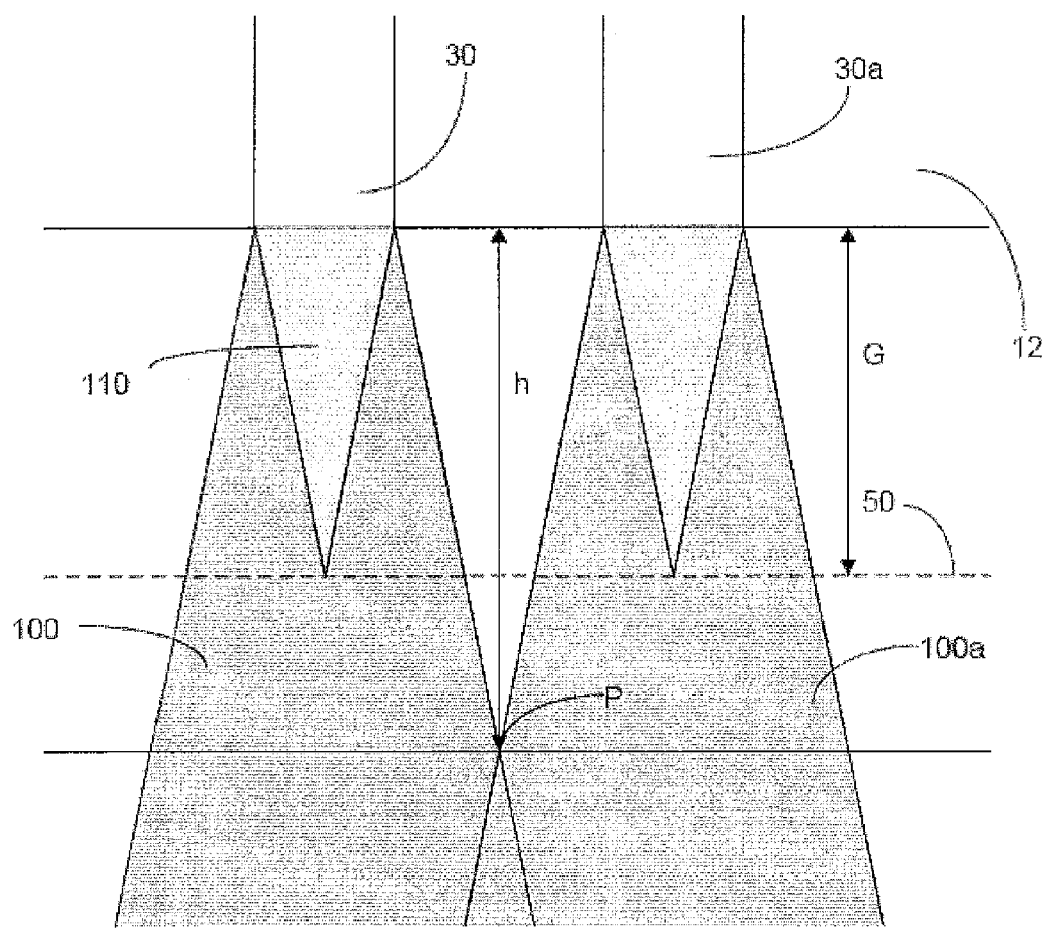
FIG. 8 illustrates schematically the various zones of a jet of fluid leaving an opening in a fluid handling system.

FIG. 8 illustrates two openings 30, 30a of the fluid handling system 12 in cross-section. Jets of liquid 100, 100a are illustrated as exiting from each opening 30, 30a. The jets comprise a jet core 110 in which the velocity of liquid is constant. The velocity of the liquid may be greatest in the jet core 110. The jet core 110 decreases in cross-sectional area with distance from the opening 30. However, the cross-sectional area of the overall jet 100, 100a increases with distance from the opening 30.

It has been found that bubbles can be included into immersion liquid if the jet core 110 extends to the substrate W or substrate table WT. In particular, it has been found that if the jet core 110 touches the edge of the gap 40 bubbles can be included in the immersion liquid. Therefore, it is desirable that the bottom of the jet core 110 is positioned between the opening 30, 30a and the top surface of the substrate table and/or substrate W. However, an improvement in performance is available if the jet core 110 does not reach the bottom of the gap 40. For example, if the bottom of the jet core 110 is positioned in the top half of the gap 40, an improvement in performance is available. Thus, the length of the jet core 110 is desirably less than the operating distance plus half of the depth of the gap 40. In one embodiment the jet core 110 does not extend beyond the groove 50. This is illustrated in FIG. 8 by the dashed line which shows the depth G of the groove 50 necessary for the jet core 110 to be contained within the groove. In another embodiment the jet core 110 extends beyond the groove 50. This may be advantageous from a manufacturing and/or flow rate point of view because openings 30 with a larger dimension, e.g., length or width, may then be used. In an embodiment, the opening is substantially circular in shape so that the dimension of the opening may be considered to be the diameter of the opening.

A mathematical relationship can be written for the length of the jet core 110 (i.e. the distance between the opening 30, 30a and the tip of the jet core 110) as follows: length of jet core=8.375 r, wherein r is the one-half the dimension (or radius when the opening is circular) of the opening 30, 30a. Using this equation it can be seen if that if the dimension of the opening 30, 30a is less than the operating distance divided by 3.5, the jet core 110 should be positioned between the opening 30, 30a and the top surface of the substrate table WT and/or substrate W. If the dimension of the opening 30, 30a is less than the 1/3.5 multiplied by sum of the operating distance and half of the gap 40 depth, then advantages will also be present as described above.

Therefore, as can be seen, it is desirable to place the opening 30, 30a in a groove 50 so that the opening 30, 30a is positioned further from the top surface of the substrate table and/or substrate W than the undersurface 22 of the fluid handling system 12. This allows the fly height of the fluid handling system to be kept low whilst increasing the distance between the opening 30, 30a and top surface of the substrate table WT and/or substrate W.

In one embodiment the dimension of the at least one opening 30 is less than the operating distance divided by 4, desirably less than the operating distance divided by 4.1875, more desirably less than the operating distance divided by 4.5 and most desirably less than the operating distance divided by 5. In one embodiment the dimension of the at least one opening 30 is at least the operating distance divided by 100. In one embodiment, the dimension of the at least one opening 30 is at least 1/3.5 multiplied by the sum of the operating distance and half of the gap 40 depth, desirably at least 1/4, 1/4.1875, 1/4.5 or 1/5 of the sum.

In one embodiment the dimension of the opening 30, 30a is less than the groove depth G divided by 3.5, desirably less than G divided by 4, more desirably less than G divided by 4.1875, more desirably less than G divided by 4.5 and most desirably less than G divided by 5. In one embodiment the dimension of the at least one opening 30 is at least the groove depth G divided by 100.

As can be seen in FIG. 8, the jet of liquid 100, 100a exiting an opening 30, 30a spreads out the further it is from the opening 30, 30a. Desirably jets 100, 100a of adjacent openings 30, 30a interact (i.e. cross like illustrated by P in FIG. 8) before the jets 100, 100a reach the top surface of the substrate table WT or substrate W, as illustrated in FIG. 8. This ensures that there is liquid with a velocity downwards towards the top surface of the substrate W and/or substrate table WT along the whole distance between each opening 30, 30a of the array of openings 30, 30a. If, for example, the top surface of the substrate W or substrate table WT were above the point P, at a position equidistant between the openings 30, 30a, there would be no liquid with a velocity down onto the surface and thereby the sweeping function of the liquid coming out of the array of openings 30, 30a would be less efficient.

It is desirable for the jets of adjacent openings to interact before the jets reach the surface of the substrate W and/or substrate table. However, it is more desirable for the jets 100, 100a of the adjacent openings 30, 30a meet before the jets 100, 100a exit the groove 50. In this way a curtain of liquid moving with a velocity downwards towards the surface of the substrate table WT and/or substrate W is present between the undersurface 22 of the fluid handling system 12 and the top surface of the substrate table WT and substrate W. The liquid flow may be refereed to as a continuous linear jet or a continuous liquid curtain. This arrangement can be effective in sweeping away bubbles in immersion liquid. Thereby a bubble may be prevented from entering the immersion space 11.

The distance h between the surface in which the openings 30, 30a are present and the point P at which the two jets 100, 100a meet can be derived geometrically. They may be derived from a knowledge of the angle which the jet 100, 100a makes to the surface in which the openings are present. For the point P to be above the top surface of the substrate table WT and/or substrate W (for an angle θ of for example 60°), the operating distance multiplied by a factor should be greater than the distance between adjacent openings 30, 30a. In an embodiment the factor is 1.16. In embodiments it may be desirable to have a smaller factor. So desirably the distance between adjacent or sequential openings in the array is less than 1.16 times the operating distance. More desirably the distance between adjacent openings 30, 30a in the array is less than 0.8 times the operating distance, yet more desirably less than 0.5 times the operating distance, yet more desirably less than 0.4 times the distance and most desirably less than 0.35 times the operating distance. In one embodiment the distance between adjacent or sequential openings in the array is at least 0.01 times the operating distance. If the distance is too small, the openings can be problematic to manufacture. In one embodiment the distance between adjacent or sequential openings in the array is at least 0.02, 0.05 or 0.1 times the operating distance. Yet more desirably, the distance between adjacent openings 30, 30a in the array is less than 1.6 times the depth G of the groove 50, desirably less than 1.8, 0.5, 0.4 or less than 0.35 times the depth G of the groove 50. The lower the distance, the more homogenous flow will be as it impinges on the substrate/substrate table or as it exits the groove 50. In one embodiment the distance between adjacent or sequential openings in the array is at least 0.01 times the depth G. If the distance is too small, the openings can be problematic to manufacture. In one embodiment the distance between adjacent or sequential openings in the array is at least 0.02, 0.05, 0.1 times the depth G.

In practice, in one embodiment the dimension of the opening 30 is less than 200 µm, in another embodiment less than 100 µM. In one embodiment the distance between adjacent openings is less than 400 µm, in another embodiment less than 300 µm. Desirably the distance in between openings is less than 200 µm and, desirably less than 100 µm and most desirably less 70 µm. The depth G of the groove 50 is desirably more than 50 µm, more desirably more than 100 µm and most desirably more than 200 µm.

In order to ensure that the above conditions are met, a controller 100 is provided to control the fly height of the fluid handling system 12. The controller 100 may be programmable by an operator to vary the fly height. The controller 100 may control the flow rate of liquid out of the openings. Note that the rate of liquid flow does not effect the shape of the jet 100 or jet core 110. However, variation of these variables may alter the operating conditions of the fluid confinement structure. This may be desirable for a user of a lithographic apparatus embodying the invention to optimize the operating conditions for specific device manufacturing and process conditions. Such process conditions may be bespoke and be only used a by a specific customer. For example, the operating conditions may be optimized to scan over different types of coating, such as topcoat, resist (including topcoatless resist) and substrate edge seals (also known as wafer edge seals). The coating may a specific contact angle and may be hydrophobic or hydrophilic. The operating conditions may be optimized to manufacture a specific type of device.

As will be appreciated, any of the above described features can be used with any other feature and it is not only those combinations explicitly described which are covered in this application.

In an embodiment, there is provided a lithographic apparatus comprising: a substrate table, and a fluid handling structure. The substrate table is configured to support a substrate. The fluid handling structure has an opening. The opening has a dimension and in use is positioned to direct a flow of liquid towards the substrate and/or the substrate table. The opening is spaced from the substrate and/or the substrate table by an operating distance. The dimension of the opening is less than the operating distance divided by 3.5.

The dimension of the opening may be less than the operating distance divided by 4, desirably divided by 4.1875, desirably divided by 4.5, or desirably divided by 5. The fluid handling structure may further comprise a groove in a surface facing, in use, the substrate and/or the substrate table. The opening may be positioned in the groove. The dimension of the opening may be less than the depth of the groove divided by 3.5, desirably divided by 4, desirably divided by 4.1875, desirably divided by 4.5, or desirably divided by 5.

The opening may have a dimension of less than 200 µm, desirably less than 100 µm. The opening may comprise a plurality of openings in an array. A distance between adjacent openings in the array may be less than 1.16 times the operating distance.

In an embodiment, there is provided a lithographic apparatus comprising: a substrate table and a fluid handling structure. The substrate table may be configured to support a substrate. The fluid handling structure may have an opening. The opening may have a dimension and in use may be positioned to direct a liquid flow towards the substrate and/or the substrate table. The dimension of the opening is such that in use the liquid flow through the opening may form a jet core having an end positioned between the opening and the substrate and/or substrate table.

In an embodiment, there is provided a lithographic apparatus comprising: a substrate table and fluid handling structure. The substrate table may be configured to support a substrate. The substrate table may comprise a gap located between the edge of the substrate table and the substrate. The gap may have a depth. The fluid handling structure may have an opening. The opening may have a dimension and in use may be positioned to direct a flow of liquid towards the substrate and/or the substrate table. The opening may be spaced from the substrate and/or the substrate table by an operating distance. The dimension of the opening may be less than 1/3.5 multiplied by the sum of the operating distance and half of the depth of the gap.

The dimension of the opening may be less than 1/4, desirably less than 1/4.1875, desirably less than 1/4.5, or desirably less than 1/5 multiplied by the sum.

In an embodiment, there is provided a lithographic apparatus comprising: a substrate table and a fluid handling structure. The substrate table may be configured to support a substrate. The substrate table may comprise a gap between the edge of the substrate table and the substrate. The fluid handling structure may have an opening. The opening may have a dimension. The opening in use may be positioned to direct a liquid flow towards the substrate and/or the substrate table. The dimension of the opening may be such that in use the liquid flow through the opening forms a jet core having an end positioned between the opening and half way down the gap.

In an embodiment, there is provided lithographic apparatus comprising: a substrate table and a fluid handling structure. The substrate table is configured to support a substrate. The fluid handling structure has an array of openings. Adjacent openings in the array are a distance apart. In use the array of openings are positioned to direct a flow of fluid towards the substrate and/or substrate table. In use the array of openings are at an operating distance away from the substrate and/or substrate table. The distance between adjacent openings in the array is less than 1.16 times the operating distance.

The distance between adjacent openings in the array maybe less than 0.8, desirably less than 0.5, desirably less than 0.4 or desirably less than 0.35 times the operating distance. The fluid handling structure may further comprises a groove in a surface facing, in use, the substrate and/or substrate table, and wherein the array of openings may be in the groove. The distance between adjacent openings in the array may be less than 1.16 times the depth of the groove, desirably less than 0.8, desirably less than 0.5, desirably less than 0.4 or desirably less than 0.35 times the depth of the groove. The distance between adjacent openings may be less than 400 µm, desirably less than 300 µm, desirably less than 200 µm, desirably less than 100 µm or desirably less than 70 µm. The lithographic apparatus may further comprise a controller configured to control the magnitude of the operating distance.

In an embodiment, there is provided a lithographic apparatus comprising: a substrate table and a fluid handling structure. The substrate table is configured to support a substrate. The fluid handling structure has an array of openings. Adjacent openings in the array are positioned a distance apart, and in use the array of openings are configured to direct a liquid flow towards the substrate and/or substrate table. The liquid flow through each opening forms a jet. The distance between adjacent openings in the array is such that the jets of liquid exiting adjacent openings meet before reaching the substrate and/or substrate table.

In an embodiment, there is provided a fluid handling structure having a groove in a bottom surface which faces the substrate and/or substrate table in use, and at least one opening in the groove. The opening is constructed and arranged to direct, in use, a flow of liquid towards a substrate and/or a substrate table. The substrate table is configured to support the substrate.

The groove may have a depth of more than 50 μm, desirably more than 100 μm, or desirably more than 200 μm.

In an embodiment, there is provided a device manufacturing method comprising: providing a fluid between a final element of a projection system and a substrate and/or a substrate table configured to support the substrate. The providing includes supplying liquid between a fluid handling structure and the substrate through an opening. A dimension of the opening is less than the distance between the opening and the substrate divided by 3.5.

In an embodiment, there is provided a device manufacturing method comprising: providing a fluid between a final element of a projection system and a substrate and/or a substrate table configured to support the substrate. The providing includes supplying liquid between a fluid handling structure and the substrate through an opening. A dimension of the opening is less than 1/3.5 multiplied by the distance between the opening and the substrate and half of the depth of a gap between the edge of the substrate table and the substrate.

In an embodiment, there is provided a device manufacturing method comprising: providing a fluid between a final element of a projection system and a substrate and/or a substrate table configured to support the substrate. The providing includes supplying liquid between a fluid handling structure and the substrate and/or the substrate table through an array of openings. Adjacent openings of the array are positioned apart by less than 1.16 times the distance of at least one of the openings from the substrate.

In an embodiment, there is provided a device manufacturing method comprising: providing a fluid between the final element of a projection system and a substrate and/or a substrate table configured to support the substrate. The providing includes supplying liquid between a fluid handling structure and the substrate and/or the substrate table through an opening. The opening is defined in a surface of a groove located in a bottom surface of a fluid handling structure. The bottom surface faces the substrate and/or the substrate table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a substrate table configured to support a substrate; and
a fluid handling structure having a groove in a bottom surface which faces, in use, a facing surface of the substrate and/or substrate table and an opening in the groove to form a jet, the opening having a dimension and in use being positioned to direct a flow of liquid towards the substrate and/or the substrate table, and being spaced from the substrate and/or the substrate table by an operating distance, the dimension of the opening being less than the operating distance divided by 3.5 and the jet having a jet core with an axis substantially perpendicular to the facing surface of the substrate and/or the substrate table.

2. The lithographic apparatus of claim 1, wherein the dimension of the opening is less than the operating distance divided by 4.

3. The lithographic apparatus of claim 1, wherein the dimension of the opening is less than the depth of the groove divided by 3,5.

4. The lithographic apparatus of claim 1, wherein the opening has a dimension of less than 200 μm.

5. The lithographic apparatus of claim 1, wherein the opening comprises a plurality of openings in an array.

6. The lithographic apparatus of claim 5, wherein a distance between adjacent openings in the array is less than 1.16 times the operating distance.

7. The lithographic apparatus of claim 1, further comprising a controller configured to control the magnitude of the operating distance.

8. A lithographic apparatus comprising:
a substrate table configured to support a substrate; and
a fluid handling structure having a groove in a bottom surface which faces, in use, a facing surface of the substrate and/or substrate table and an opening, in the groove to form a jet, the opening having a dimension and in use being positioned to direct a liquid flow towards the substrate and/or the substrate table, the dimension of the opening is such that in use the liquid flow through the opening forms a jet core having an end positioned between the opening and the substrate and/or substrate table and having an axis substantially perpendicular to the facing surface of the substrate and/or the substrate table.

9. A lithographic apparatus comprising:
a substrate table configured to support a substrate, the substrate table comprising a gap located between the edge of the substrate table and the substrate, the gap having a depth; and
a fluid handling structure having an opening, the opening having a dimension and in use being positioned to direct a flow of liquid towards the substrate and/or the substrate table and being spaced from the substrate and/or the substrate table by an operating distance, the dimension of the opening being less than 1/3.5 multiplied by the sum of the operating distance and half of the depth of the gap and the dimension of the opening being such that in use the liquid flow through the opening forms a jet core having an end positioned between the opening and half way down the gap.

10. A lithographic apparatus comprising:
a substrate table configured to support a substrate and comprising a gap between the edge of the substrate table and the substrate; and
a fluid handling structure having an opening, the opening having a dimension and in use being positioned to direct a liquid flow towards the substrate and/or the substrate table, the dimension of the opening is such that in use the liquid flow through the opening forms a jet core having an end positioned between the opening and half way down the gap.

11. A lithographic apparatus comprising:
a substrate table configured to support a substrate; and
a fluid handling structure having a groove in a bottom surface which faces, in use, a facing surface of the substrate and/or substrate table and an array of openings in the groove to form a plurality of jets, adjacent openings in the array being a distance apart and in use the array of openings being positioned to direct a flow of fluid towards the substrate and/or substrate table and to be at an operating distance away from the substrate and/or substrate table, the distance between adjacent openings in the array being less than 1.16 times the operating distance and at least one of the jets having a jet core with an axis substantially perpendicular to the facing surface of the substrate and/or the substrate table.

12. The lithographic apparatus of claim 11, wherein the distance between adjacent openings in the array is less than 0.8 times the operating distance.

13. A lithographic apparatus comprising:
a substrate table configured to support a substrate; and
a fluid handling structure having a groove in a bottom surface which faces, in use, a facing surface of the substrate and/or substrate table and an array of openings in the groove, adjacent openings in the array being positioned a distance apart, and in use the array of openings being configured to direct a liquid flow towards the substrate and/or substrate table, the liquid flow through each opening forming a jet, the distance between adjacent openings in the array being such that the jets of liquid exiting adjacent openings meet before reaching the substrate and/or substrate table and at least one of the jets having a jet core with an axis substantially perpendicular to the facing surface of the substrate and/or the substrate table.

14. A fluid handling structure having a groove in a bottom surface which faces, in use, a facing surface of a substrate and/or a substrate table configured to support the substrate, and at least one opening in the groove to form a jet, the opening being constructed and arranged to direct, in use, a flow of liquid towards the substrate and/or the substrate table, the jet having a jet core with an axis substantially perpendicular to the facing surface of the substrate and/or the substrate table.

15. A device manufacturing method comprising:
providing a fluid between a final element of a projection system and a substrate and/or a substrate table configured to support the substrate, the providing including supplying liquid between a fluid handling structure and the substrate and/or the substrate table through an opening to form a jet, the opening being defined in a surface of a groove located in a bottom surface of the fluid handling structure, the bottom surface facing a facing surface of the substrate and/or the substrate table, wherein a dimension of the opening is less than the distance between the opening and the substrate divided by 3.5 and the jet has a jet core with an axis substantially perpendicular to the facing surface of the substrate and/or the substrate table.

16. A device manufacturing method comprising:
providing a fluid between a final element of a projection system and a substrate and/or a substrate table configured to support the substrate, the providing including supplying liquid between a fluid handling structure and the substrate through an opening, a dimension of the opening being less than 1/3.5 multiplied by the distance between the opening and the substrate and half of the depth of a gap between the edge of the substrate table and the substrate and the dimension of the opening being such that the liquid flow through the opening forms a jet core having an end positioned between the opening and half way down the gap.

17. A device manufacturing method comprising:

providing a fluid between a final element of a projection system and a substrate and/or a substrate table configured to support the substrate, the providing including supplying liquid between a fluid handling structure and the substrate and/or the substrate table through an array of openings to form a jet, the openings being defined in a surface of a groove located in a bottom surface of the fluid handling structure, the bottom surface facing a facing surface of the substrate and/or the substrate table, wherein adjacent openings of the array are positioned apart by less than 1.16 times the distance of at least one of the openings from the substrate and the jet has a jet core with an axis substantially perpendicular to the facing surface of the substrate and/or the substrate table.

18. A device manufacturing method comprising:

providing a fluid between a final element of a projection system and a substrate and/or a substrate table configured to support the substrate, the providing including supplying liquid between a fluid handling structure and the substrate and/or the substrate table through an opening to form a jet, the opening being defined in a surface of a groove located in a bottom surface of the fluid handling structure, the bottom surface facing a facing surface of the substrate and/or the substrate table, the jet having a jet core with an axis substantially perpendicular to the facing surface of the substrate and/or the substrate table.

* * * * *